(12) United States Patent
Wu (10) Patent No.: US 8,052,430 B2
(45) Date of Patent: Nov. 8, 2011

(54) CABLE ASSEMBLY HAVING CONNECTOR WITH INTERIOR PRINTED CIRCUIT BOARD FACILITATING TERMINATION

(75) Inventor: Jerry Wu, Irvine, CA (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 672 days.

(21) Appl. No.: 12/157,386

(22) Filed: Jun. 9, 2008

(65) Prior Publication Data
US 2009/0301761 A1 Dec. 10, 2009

(51) Int. Cl.
*H01R 12/00* (2006.01)

(52) U.S. Cl. ...................................................... 439/76.1

(58) Field of Classification Search .................. 439/76.1, 439/607.05, 607.41, 607.46, 607.47, 607.51
See application file for complete search history.

(56) References Cited

U.S. PATENT DOCUMENTS

| | | | | |
|---|---|---|---|---|
| 4,849,944 A * | 7/1989 | Matsushita | ................... | 714/718 |
| 5,124,888 A * | 6/1992 | Suzuki et al. | ................. | 361/740 |
| 5,244,397 A * | 9/1993 | Anhalt | .......................... | 439/101 |
| 5,486,117 A * | 1/1996 | Chang | ........................... | 439/357 |
| 6,162,086 A * | 12/2000 | Kuo | ................ | 439/497 |
| 6,179,627 B1 * | 1/2001 | Daly et al. | ................... | 439/76.1 |
| 6,210,216 B1 * | 4/2001 | Tso-Chin et al. | ............. | 439/545 |
| 6,431,901 B1 * | 8/2002 | Yeh | ................ | 439/357 |
| 6,585,528 B1 * | 7/2003 | Lin et al. | ...................... | 439/76.1 |
| 6,776,658 B2 * | 8/2004 | Tang | ........................ | 439/607.58 |
| 6,893,270 B2 * | 5/2005 | Sercu | ........................... | 439/76.1 |
| 6,913,482 B1 * | 7/2005 | Wu | ................................ | 439/502 |
| 7,131,862 B2 * | 11/2006 | Vermeersch | ................... | 439/497 |
| 7,223,915 B2 * | 5/2007 | Hackman | ........................ | 174/36 |
| 7,244,126 B2 * | 7/2007 | Morana et al. | ............... | 439/76.1 |
| 7,253,365 B2 * | 8/2007 | Crane et al. | .................... | 174/551 |
| 7,359,208 B2 * | 4/2008 | Ni | ................................ | 361/752 |
| 7,364,465 B2 * | 4/2008 | Wu | .......................... | 439/607.55 |
| 7,384,275 B2 * | 6/2008 | Ngo | ............................. | 439/76.1 |
| 7,410,366 B2 * | 8/2008 | Wu | ............................. | 439/76.1 |
| 7,520,757 B2 * | 4/2009 | Bartholomew | ............. | 439/76.1 |
| 7,572,145 B1 * | 8/2009 | Wu | .......................... | 439/607.02 |
| 7,648,372 B2 * | 1/2010 | Wu | ............................. | 439/76.1 |
| 7,654,831 B1 * | 2/2010 | Wu | ............................. | 439/76.1 |

(Continued)

FOREIGN PATENT DOCUMENTS

CN 1274967 11/2000

(Continued)

*Primary Examiner* — Tulsidas C Patel
*Assistant Examiner* — Vladimir Imas
(74) *Attorney, Agent, or Firm* — Wei Te Chung; Andrew C. Cheng; Ming Chieh Chang (57) ABSTRACT

A cable assembly includes an insulated housing (100) and a plurality of contacts (10) received therein, each contact having a tail portion extending beyond rear surface of the insulated housing; a printed circuit board (2) having a front portion and an opposite rear portion, with a plurality of conductive traces (220) arranged on the front portion and a number of conductive pads (240, 242) arranged on the rear portion. The tail portions of the contacts are soldered to the conductive traces of the front portion of the printed circuit board. The conductive pads on the rear portion of the printed circuit board are separated into at least two groups and connecting to two kinds of cables (4), selectively. A cover (9) is mold over a rear portion of the connector and a front portion of corresponding cable.

14 Claims, 10 Drawing Sheets

U.S. PATENT DOCUMENTS

| | | | |
|---|---|---|---|
| 7,658,622 B2 * | 2/2010 | Bartholomew | 439/76.1 |
| 7,690,930 B2 * | 4/2010 | Chen et al. | 439/76.1 |
| 2003/0119343 A1 * | 6/2003 | Lin et al. | 439/76.1 |
| 2006/0134946 A1 * | 6/2006 | William Vermeersch | 439/76.1 |
| 2007/0187141 A1 * | 8/2007 | Bartholomew | 174/261 |

FOREIGN PATENT DOCUMENTS

| | | |
|---|---|---|
| CN | 2548285 | 4/2003 |
| CN | 2554845 | 6/2003 |
| CN | 200972919 | 11/2007 |

* cited by examiner

CABLE ASSEMBLY HAVING CONNECTOR WITH INTERIOR PRINTED CIRCUIT BOARD FACILITATING TERMINATION

FIELD OF THE INVENTION

The present invention generally relates to a cable assembly, and more particularly to a cable assembly having a printed circuit board (PCB) facilitating termination.

DESCRIPTION OF PRIOR ART

A printed circuit board, or PCB, is used to mechanically support and electrically connect electronic components using conductive pathways, or traces, etched from copper sheets laminated onto a non-conductive substrate. Alternative names are printed wiring board (PWB), and etched wiring board. A PCB populated with electronic components is a printed circuit assembly (PCA), also known as a printed circuit board assembly (PCBA).

The PCB is also widely applied in an electrical connector, especially in a cable assembly. U.S. Pat. No. 7,223,915 issued to Hackman on May 29, 2007 discloses a cable assembly includes a cable having a number of conductors therein and respectively attached to conductive pads formed on a rear portion of a PCB, a cover of two individual parts enclosing a space for accommodating the PCB therein. The PCB further has a number of conductive traces arranged on front portion thereof as mating interface for mating with a complementary connector. A strain relief member is molded on end portion of the cable and further sandwiched between a retaining member integrated with rear edge of the cover to have the cable secured to the PCB.

U.S. Pat. No. 6,431,901 issued to Yeh on Aug. 13, 2002 introduces an I/O connector includes a top cover, a bottom cover coupling to the top cover, a terminal module positioned between the bottom cover and the top cover and receiving a plurality of terminals therein, and a PCB horizontally soldered to solder portions of the terminals. The I/O connector further includes a strain relief member partially retained within the top and bottom covers and combined with a front portion of the cable which electrically connects to the PCB.

The PCB of aforementioned connector is only adapted for connecting an electrical connector and another electrically connector or a cable. Other kind of PCB is required for alternative electrical connector or cable. Furthermore, the above-described I/O connector is configured by a plurality of parts rendering a complicate assembling process thus resulting unsatisfactory yield and unwanted cost. Hence, an improved cable assembly is highly desired to overcome the aforementioned problems.

SUMMARY OF THE INVENTION

Accordingly, an object of the present invention is to provide a cable assembly which is easily manufactured.

In order to achieve the object set forth, a cable assembly in accordance with the present invention comprises a connector, including an insulated housing and a plurality of contacts received therein, each contact having a tail portion extending beyond rear surface of the insulated housing; a printed circuit board having a front portion and an opposite rear portion, with a plurality of conductive traces arranged on the front portion and a number of conductive pads arranged on the rear portion. The tail portions of the contacts are soldered to the conductive traces of the front portion of the printed circuit board. The conductive pads on the rear portion of the printed circuit board are separated into at least two groups and connecting to two kinds of cables, selectively. A cover is mold over a rear portion of the connector and a front portion of corresponding cable.

Other objects, advantages and novel features of the invention will become more apparent from the following detailed description when taken in conjunction with the accompanying drawings.

DETAILED DESCRIPTION OF PREFERRED EMBODIMENTS

Reference will now be made in detail to the preferred embodiment of the present invention.

Figure 9:
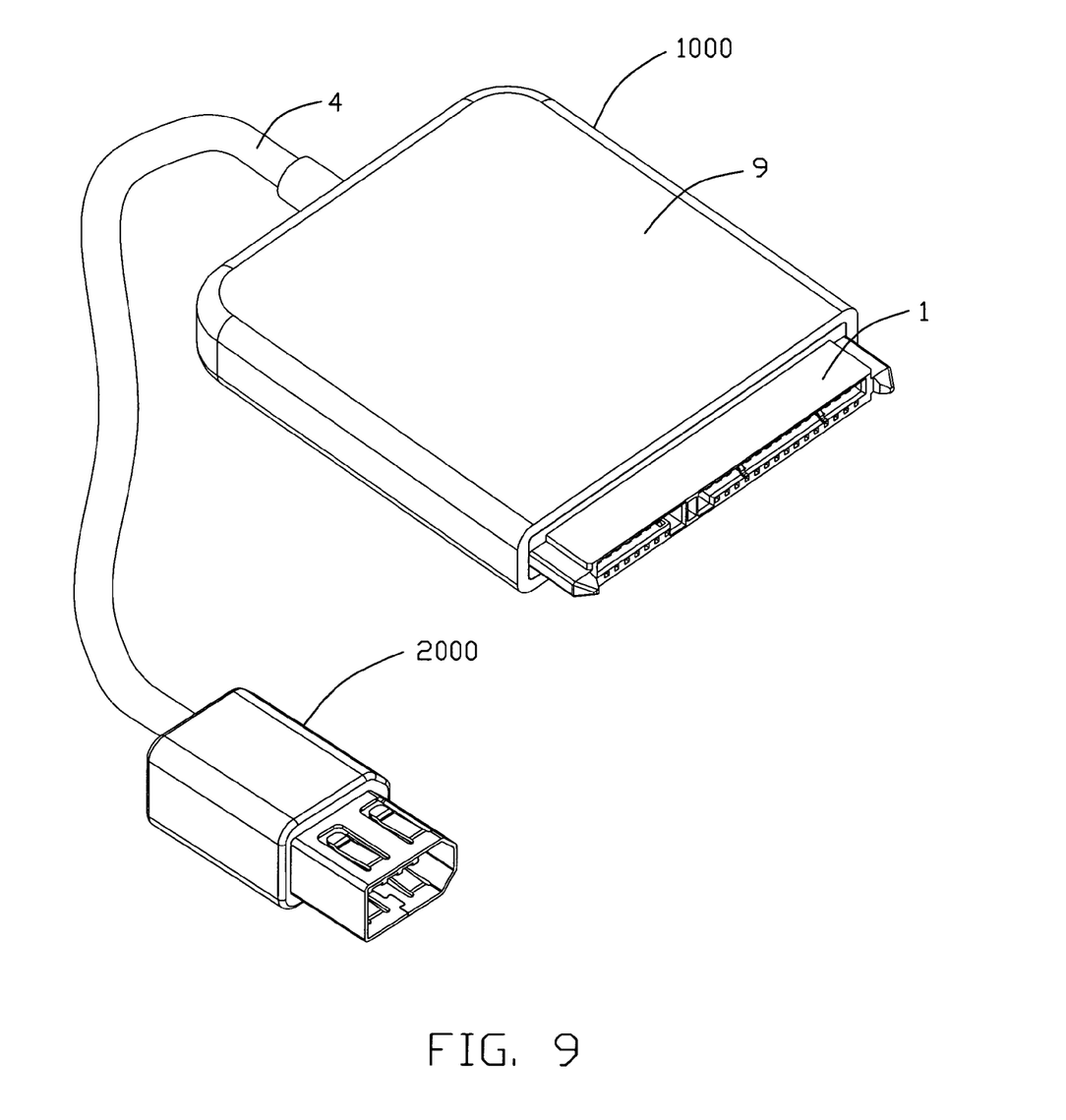
FIG. 9 shows the first connector assembly interconnects with a second connector of a cable assembly in accordance with the present invention.
Figure 10:
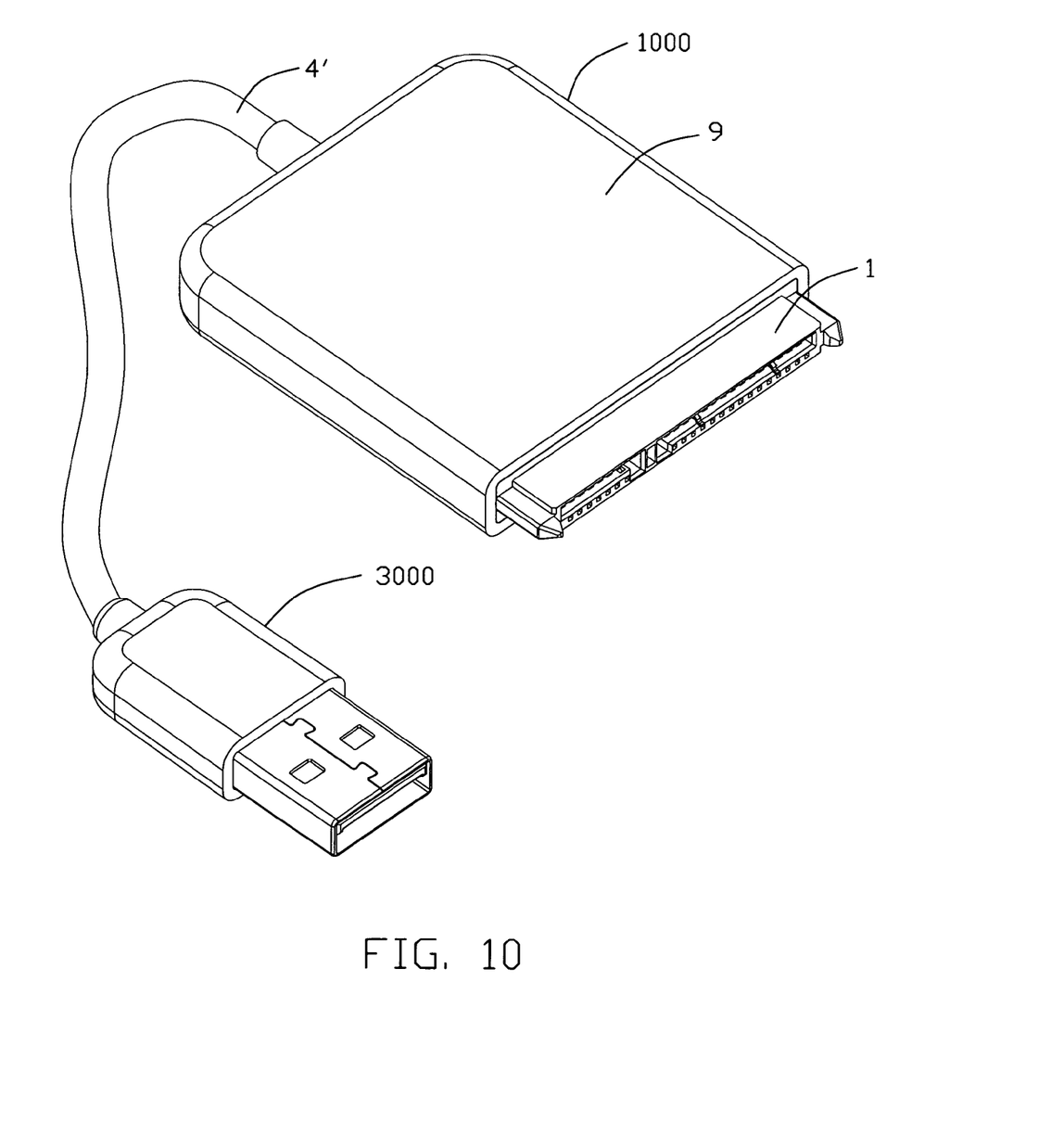
FIG. 10 shows the first connector assembly interconnects with a third connector of a cable assembly in accordance with the present invention.

Referring to FIGS. 9-10, a cable assembly in accordance with the present invention comprises a first connector assembly 1000 optionally interconnects with a second connector 2000 or third connector 3000. In the exemplary embodiment, the first connector assembly 1000 is adapted for Serial Advanced Technology Attachment (SATA) protocol, while the second connector 2000 adapted for IEEE 1394 protocol and the third connector 3000 is adapted for Universal Serial Bus (USB) protocol.

Referring to FIGS. 1-6, the first connector assembly 1000 comprises a first connector 1 with a number of contacts 10 received therein, a printed circuit board (PCB) 2, a first interior insulator 3, a cable 4, a second interior insulator 7 and a cover 9.

Figure 1:
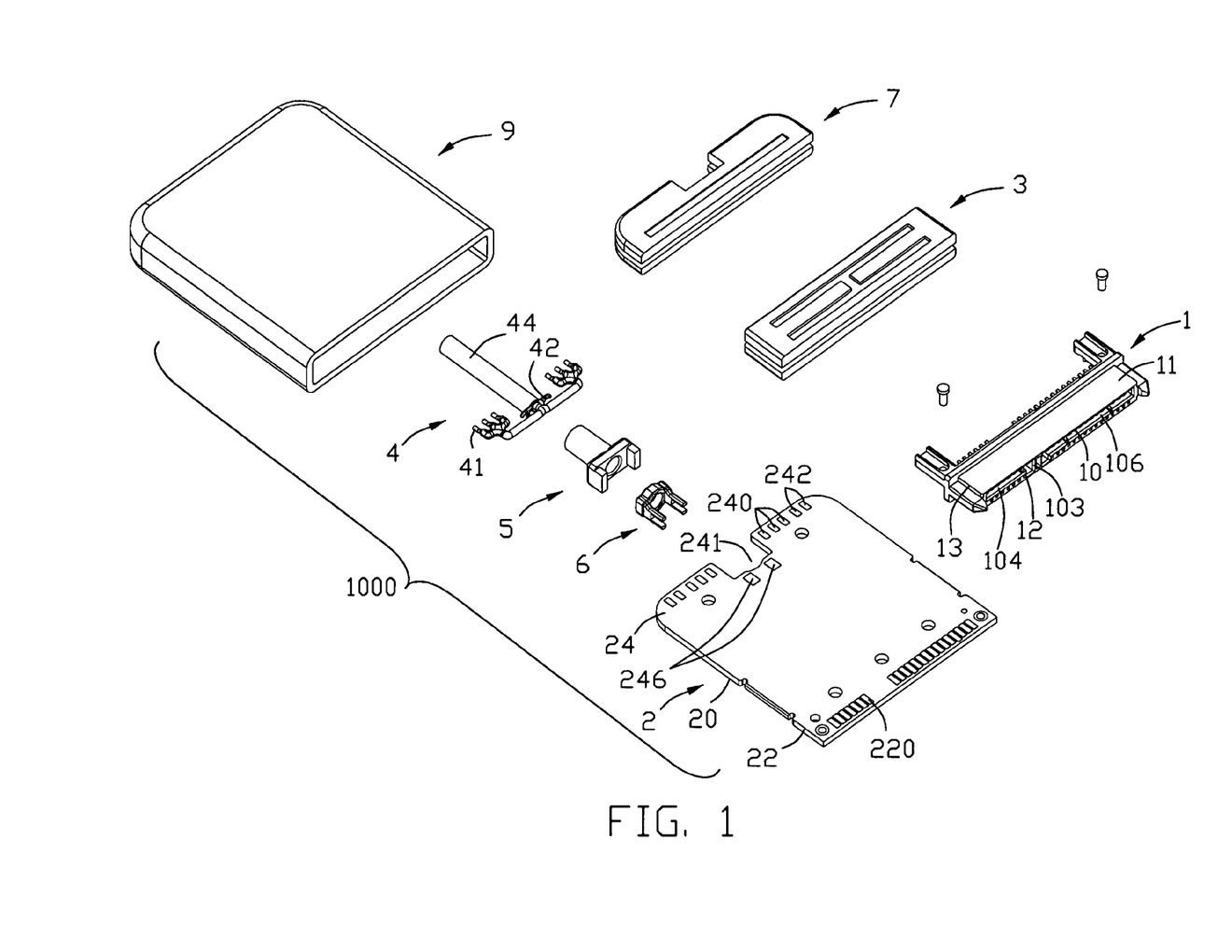
FIG. 1 is an exploded, perspective view of a first connector assembly.
Figure 2:
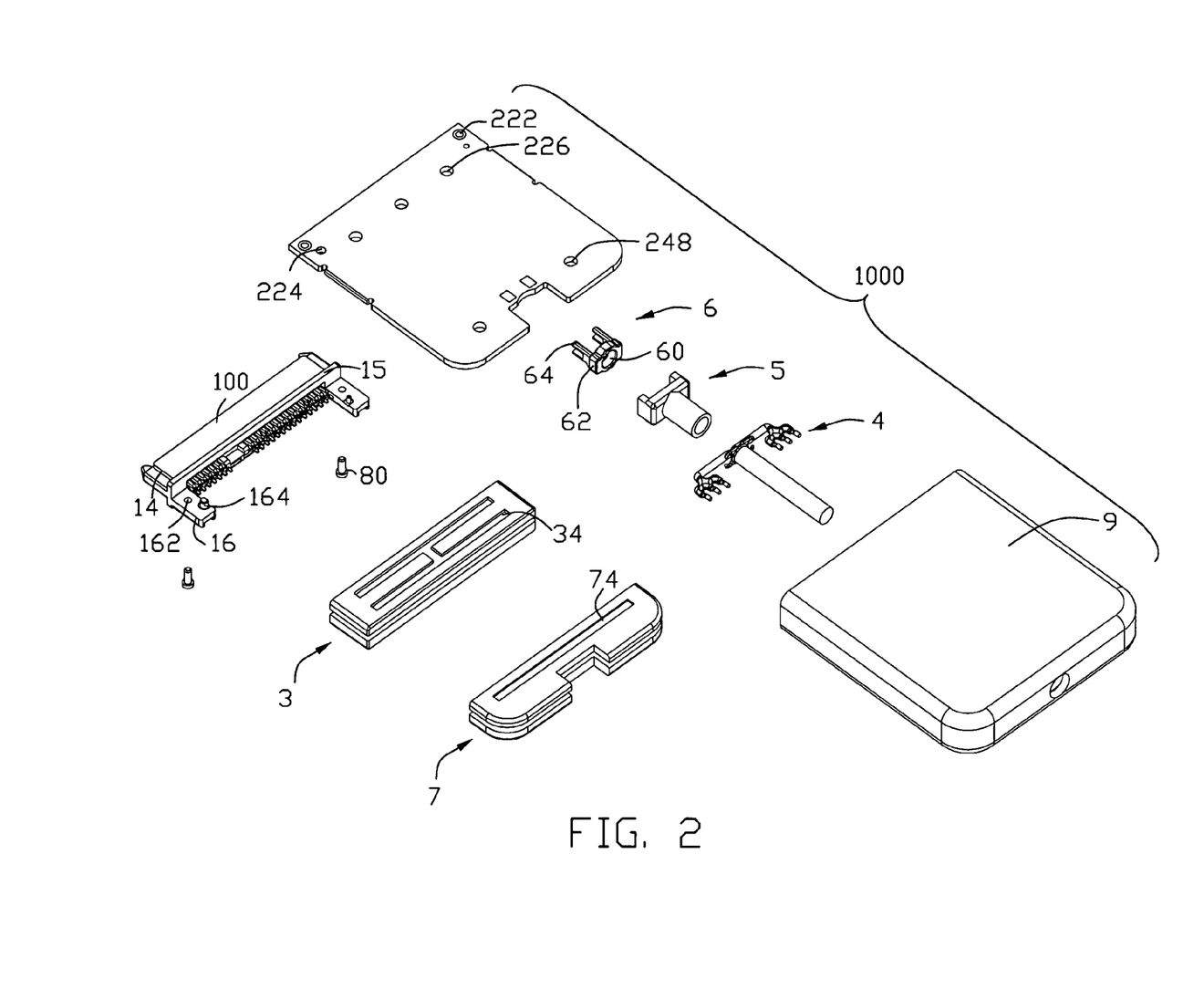
FIG. 2 is similar to FIG. 1, but viewed from another aspect.
Figure 3:
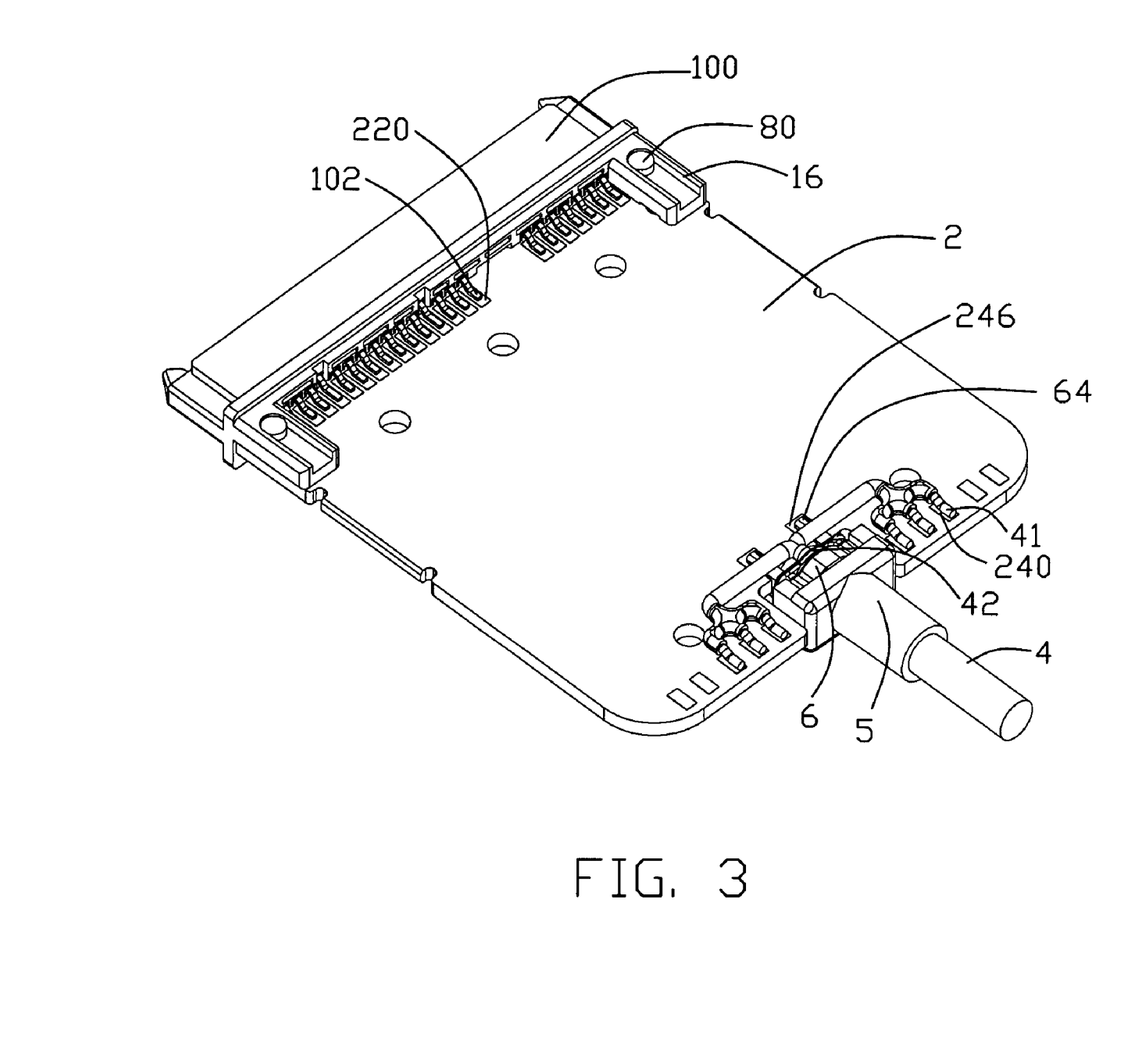
FIG. 3 is a partially assemble view of the first connector assembly.
Figure 4:
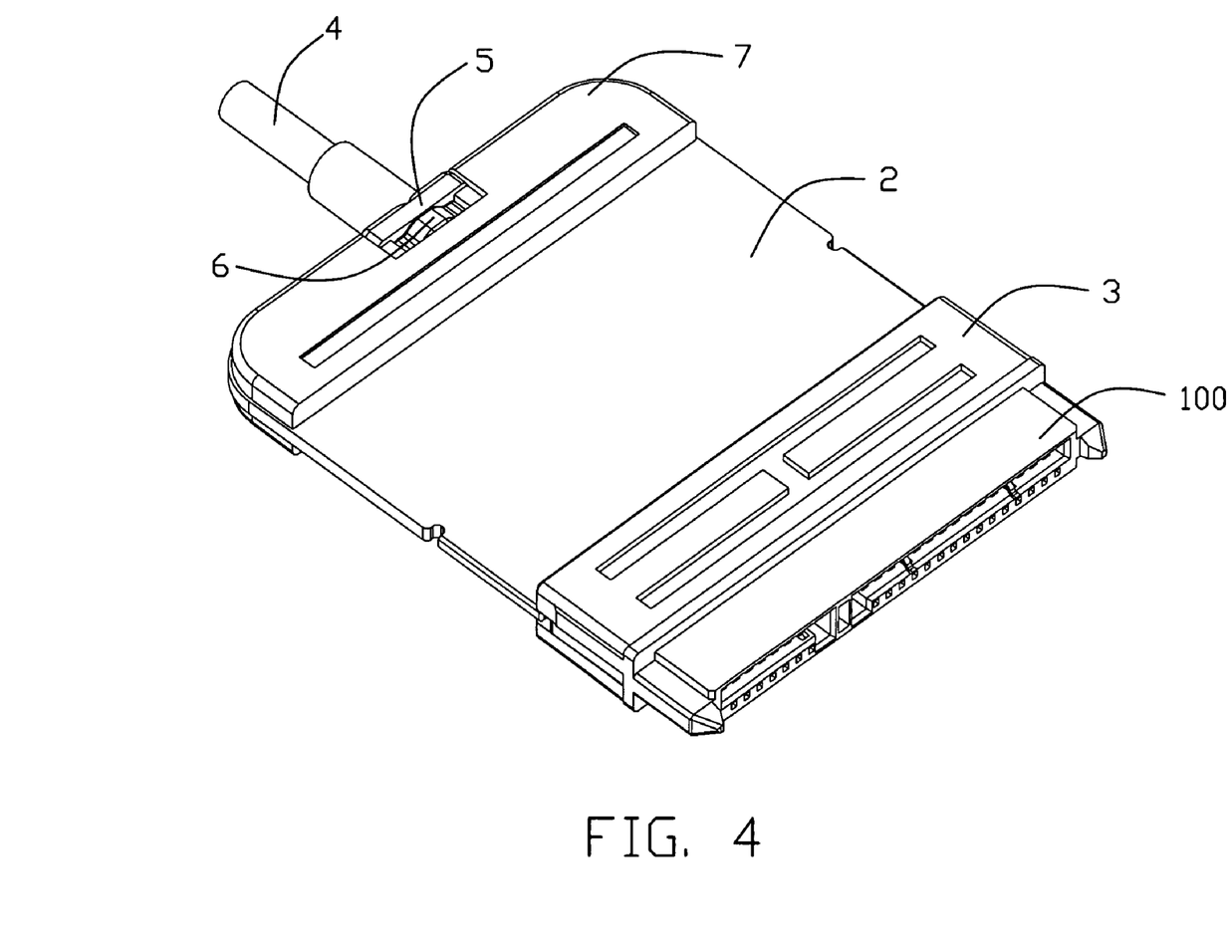
FIG. 4 is another partially assembled view of the first connector assembly.
Figure 5:
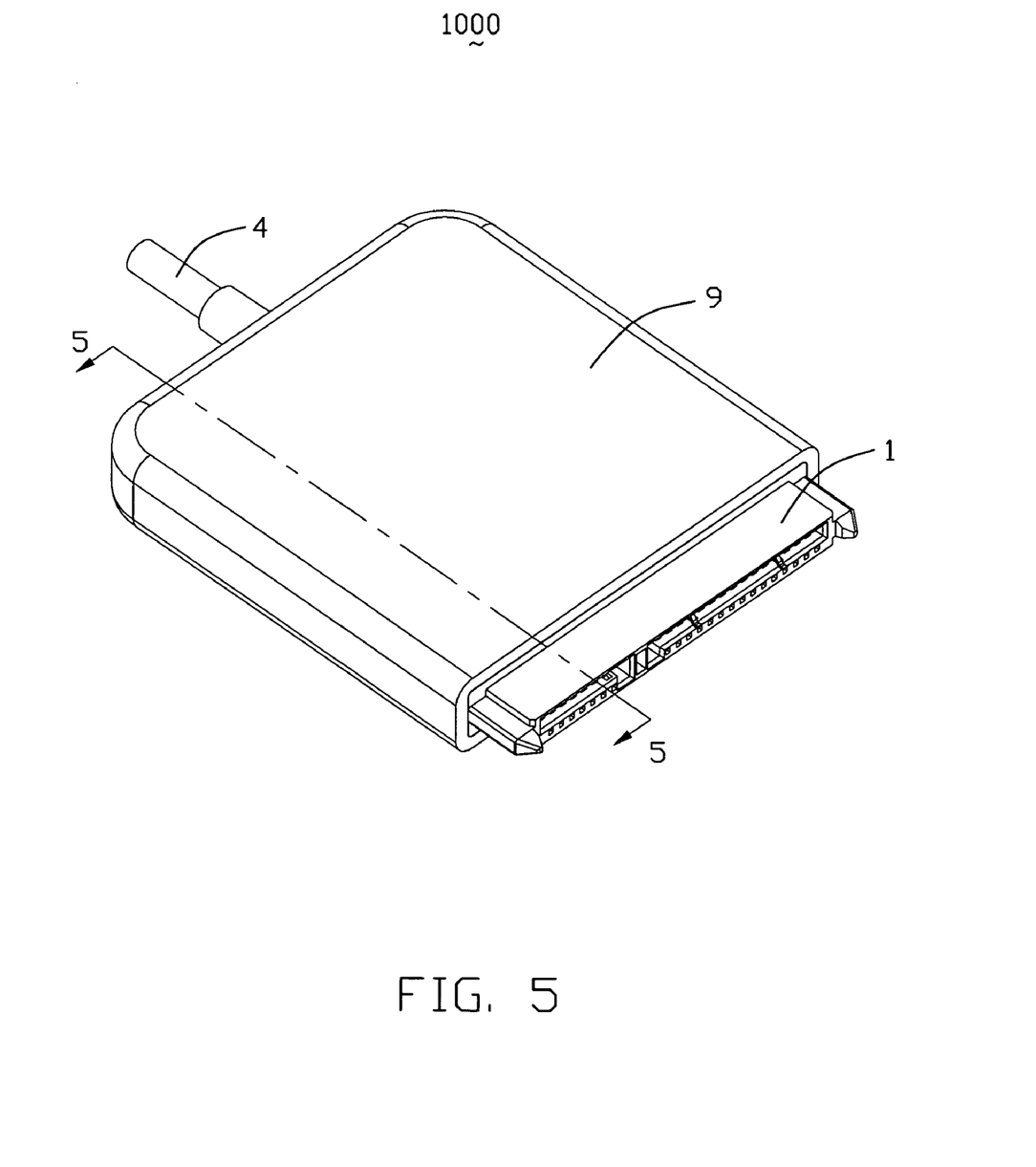
FIG. 5 is an assembled, perspective view of the first connector assembly.
Figure 6:
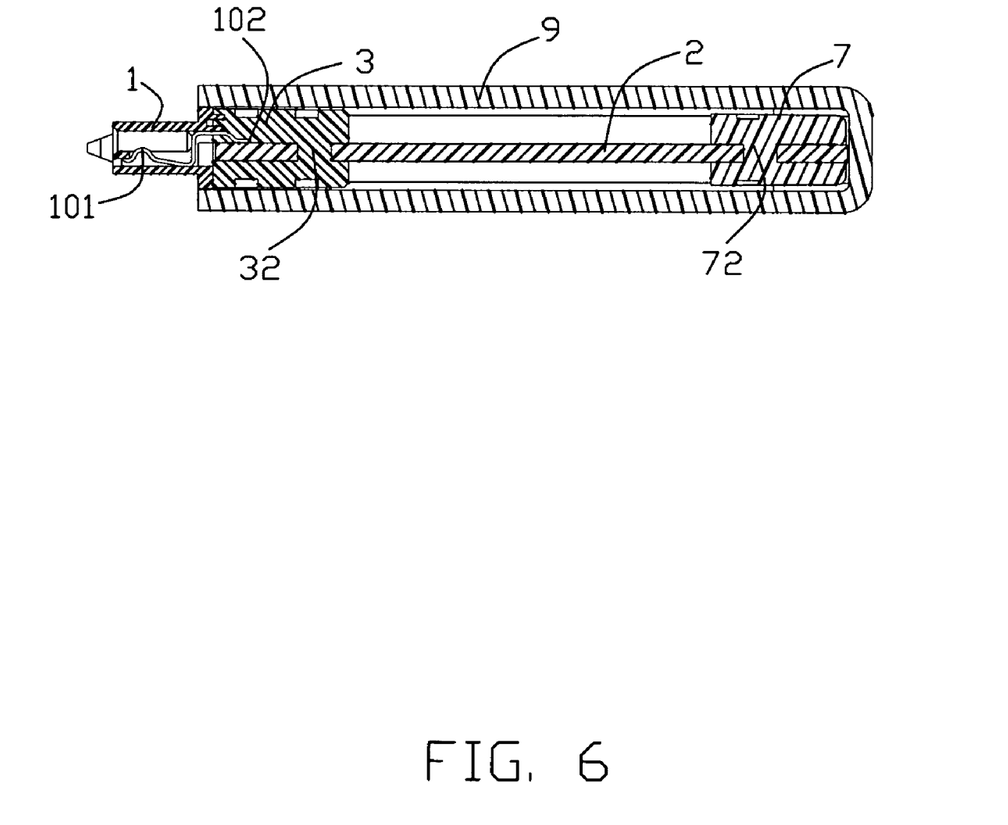
FIG. 6 is cross-section view taken along line 6-6 of the FIG. 5.

The first connector 1 has a lengthwise insulated housing 100 which has a top wall 11, a bottom wall 12 and a pair of side walls 13, 14 interconnected together to enclose a receiving space (not numbered) therebetween. The receiving space is divided into two chambers 104, 106 by a spacer 103. Both the chambers 104, 106 are L-shaped viewed from a front side. A flange portion 15 is attached to a rear edge of the insulated housing 100 and extends beyond up and low surfaces of the top and bottom walls 11, 12. A pair of arms 16 are integrated with the insulated housing 100 and extend rearward from lateral sides of an upper section of a back side of the flange portion 15. Each arm 16 has a positioning hole 162 in a front section and a position post 164 on a rear section thereof.

The PCB 2 includes a circuit substrate 20, with a set of conductive traces 220 arranged on a front portion 22 thereof, a cutout 241 in a rear portion 24 thereof, a plurality of first conductive pads 240 arranged on the rear portion 24 separated into two groups and symmetrically disposed aside of the cutout 24, and a number of second conductive pads 242 arranged on the rear portion 24 and disposed outside of the group of first conductive pads 240. A group of grounding pads 246 is disposed on the rear portion 24, in front of the cutout 241. A pair of spaced first holes 222 are defined in opposite corners the front portion 22 and adjacent to a front end the PCB 2. Another pair of spaced second holes 224 are disposed at back of the first holes 222. Furthermore, three spaced first retaining holes 226 are defined in the front portion 22 and proximate to the second holes 224. Two spaced second retaining holes 248 are defined in the rear portion 24.

The cable 4 includes a plurality of wires 41, a metallic braiding portion 42 enclosing the wires 40, and a jacket 44 shielding the metallic braiding portion 42. The metallic braiding portion 42 and the jacket 44 of a front portion of the cable 4 are removed away, with the wires 41 exposed outside and separated into two groups, and each group has three individual wires 41.

The first connector assembly 1000 further comprises a grounding member 6 and a strain relief member 5. The grounding member 6 includes a body portion 62 with a passage 60 therein allowing the cable 4 through, a pair of fork-shaped leg portions 64 arranged lateral sides of the body portion 62. The body portion 62 grips the jacket 44 of the cable 4. The metallic braiding portion 42 of the cable 4 is soldered to the body portion 62, while the fork-shaped leg portions 64 clip the PCB 2 and are soldered to the group of grounding pads 246 to form a grounding line. The strain relief member 5 is molded over the body portion 62 of the grounding member 6, partial of the metallic braiding portion 42 and sub-cables 40 exposed outside, the jacket 44 adjacent to the grounding member 6.

Figure 7:
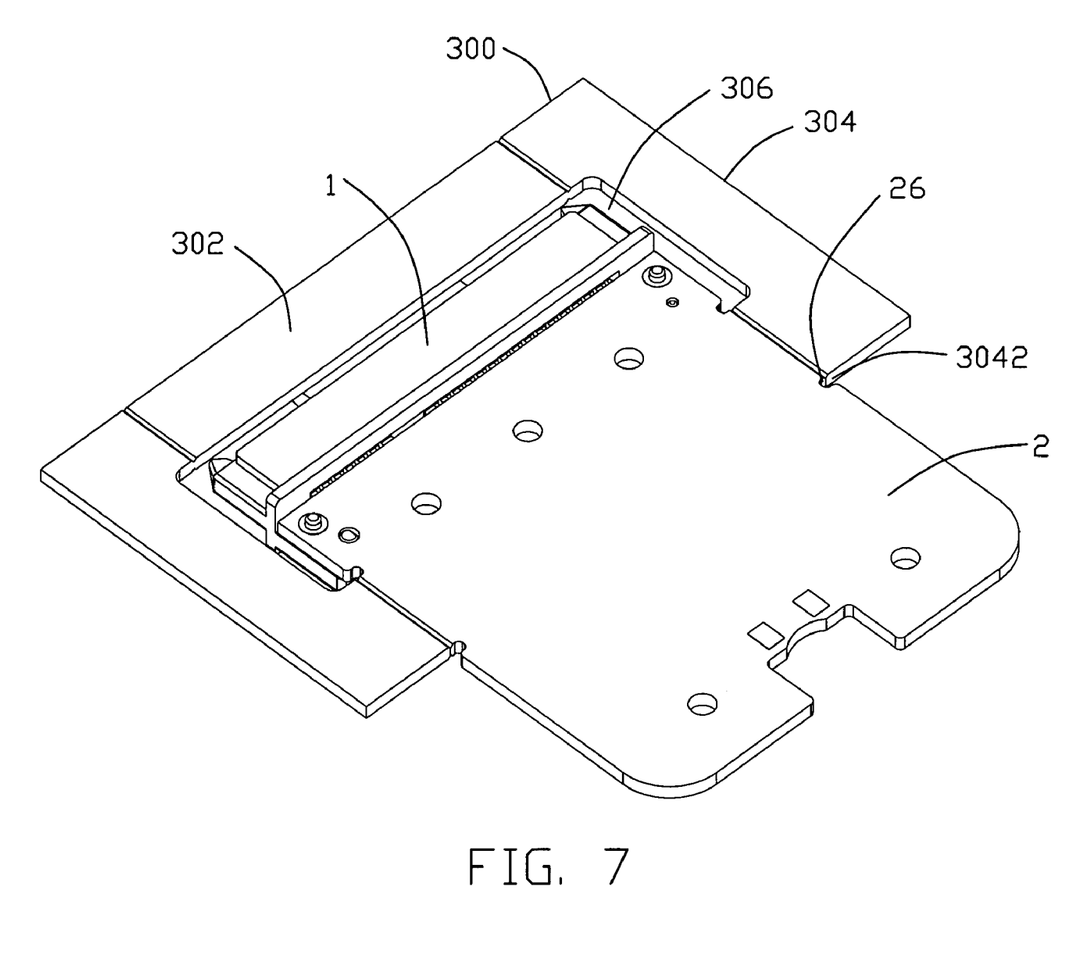
FIG. 7 illustrates a pedestal member utilized for supporting a first connector and a printed circuit board when a soldering process is taken.
Figure 8:
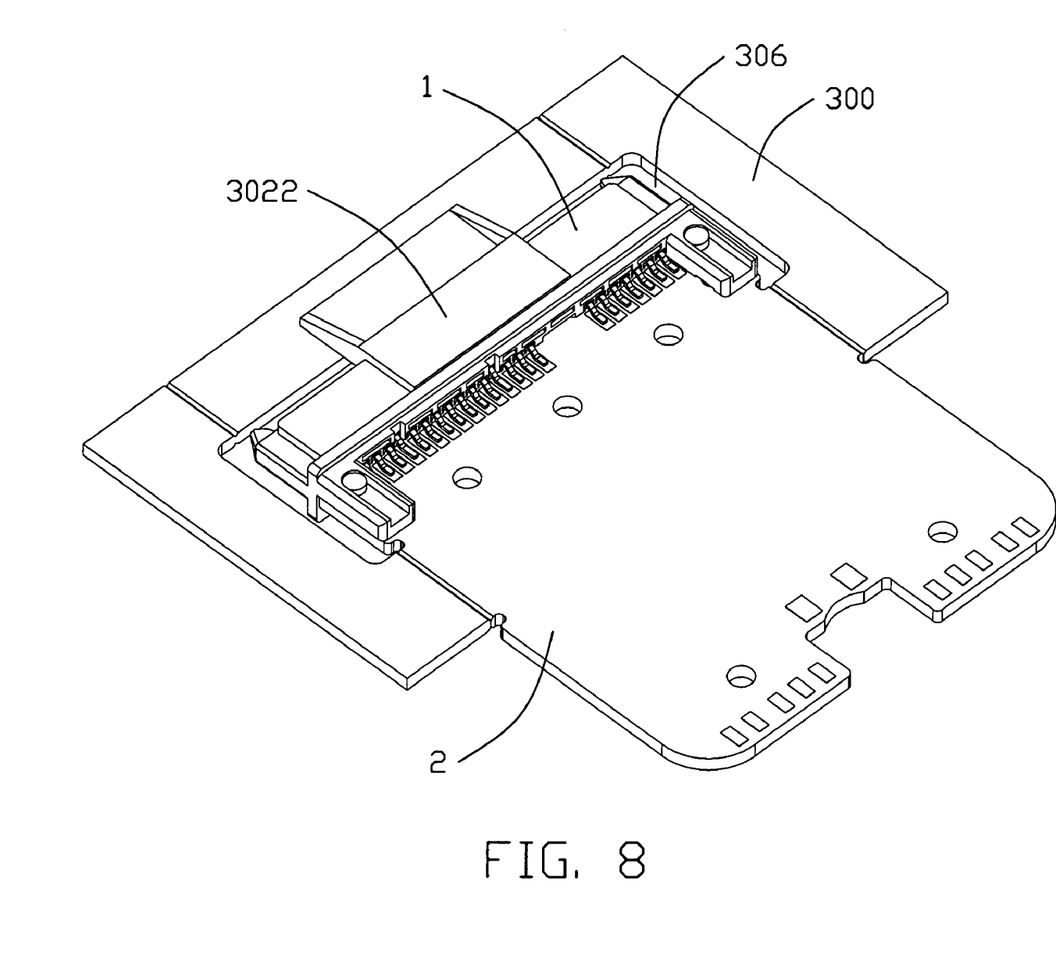
FIG. 8 is similar to FIG. 7, but viewed from another aspect.

Referring to FIGS. 7-8, a pedestal member 300 has a rear side 302 and a pair transversal side 304 interconnected to define a substantially rectangular-shaped cavity 306 therebetween. A supporting portion 3022 is formed on a middle section of the rear side 302 and disposed above the cavity 306. A rear portion of an inward surface the transversal side 304 further forms a tab 3042.

When assembly, the contacts 10 is assembled to the insulated housing 100 of the first connector 1, with mating portions 101 extending into the receiving space, tail portions 102 disposed outside of a rear surface of the insulated housing 100. Then the first connector 1 and PCB 2 are held by the pedestal member 300, with the first connector 1 accommodated in a front section of the cavity 306 and disposed on a supporting portion 3022 of the pedestal member 300, and then a front portion of the PCB 2 is disposed on the pair of arms 16 of the first connector 1 and received in a rear portion of the cavity 306, with the pair of position posts 164 inserted into the pair of spaced second holes 224, the rear portions 102 of the contacts 10 disposed on the conductive traces 220 of the front portion 22 of PCB 2 and the tab 3042 of the transversal side locked into a cutout 26 of the PCB 2. A pair of bolts 80 assembled to positioning holes 162 and the pair of first holes 222 to fasten the insulated housing 100 and the PCB 2 together. The tail portions 102 of the contacts 10 are soldered to the conductive traces 220 of the PCB 2.

Secondly, after the grounding member 6 is crimped to the cable 4 and the strain relief member 5 is molded to thereon, then the strain relief member 5 partially disposed in the cutout 241 of the PCB 2 and the wires 41 are soldered to the first conductive pads 240.

Thirdly, the first interior insulator 3 is molded to the front portion 22 of the PCB 2, the pair of the arms 16 of the insulated housing 100, the tail portions 102 of the contacts 10 and the conductive traces 220; the second interior insulator 7 is molded to the rear portion 24 of the PCB 2, the wires 41, the first conductive pads 240 and the metallic braiding portion 42 adjacent to the PCB 2. Partial of the first interior insulator 3 and second interior insulator 7 are extruded into the first retaining holes 226 and the second retaining holes 248 to form corresponding first retainers 32 and second retainers 72 locked therein, respectively. Peripheral portions of the first and second interior insulators 3, 7 further form notches 34, 74 thereon.

Fourthly, the cover 9 is molded over the first interior insulator 3, the second interior insulator 7 and the strain relief member 5. However, it should be aware that the cover 9 may be pre-molded and assembled to the first interior insulator 3 and the second interior insulator 7; and the glue (not shown) may be applied to the notches 34, 74, which may enhance the combination therebetween. Fifthly, the cable 4 is coupled to the second connector 2000.

FIG. 10 illustrates that the first connector assembly 1000 connects to the third connector 3000 via another cable 4'. The cable 4' is similar to the aforementioned cable 4, excepted that only four wires therein and respectively soldered to the second conductive pads 242, and other same structure is omitted hereby.

In the preferred embodiment, the first connector assembly 1000 is coupled to the second connector 2000 and the third connector 3000 by selecting different conductive pads of the PCB 2, However, more different conductive pads for more connectors is anticipated by the present invention. Furthermore, the PCB 2 can be connected to different connectors, optionally, which may be convenient for producers, and the cost of the production is decreased.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

The invention claimed is:

1. A cable assembly, comprising:
a connector, including an insulated housing and a plurality of contacts received therein, each contact having a tail portion extending beyond rear surface of the insulated housing;
a single printed circuit board having a front portion and an opposite rear portion, with a plurality of conductive traces arranged on the front portion and a number of conductive pads arranged on the rear portion;
wherein the tail portions of the contacts are soldered to the conductive traces of the front portion of the printed circuit board;
wherein the conductive pads on the rear portion of the printed circuit board are separated into at least two groups and connecting to two different kinds of cables, selectively, under condition that each kind of the two different kinds of cables is self-grouped;
wherein a cover is attached to a rear portion of the connector and a front portion of corresponding cable;
wherein the conductive pads comprises a group of first conductive pads and another group of second conductive pads symmetrically arranged along the rear portion;
wherein one of the cables has a number of wires soldered to the first conductive pads;

wherein a grounding member grips a front portion of the cable;

wherein the grounding member comprises a body portion attached to a jacket and soldered to a metallic braiding portion of the cable, at least a leg portion formed with the body portion and soldered to a third conductive pad on the rear portion of the printed circuit board.

2. The cable assembly as recited in claim 1, wherein the leg portion is configured to fork-shaped and clip the rear portion of the printed circuit board.

3. The cable assembly as recited in claim 2, wherein a strain relief member is molded over the grounding member and the jacket adjacent thereto.

4. The cable assembly as recited in claim 3, wherein an interior insulator is molded over the rear portion of the printed circuit board and the wires coupled thereto.

5. A cable assembly, comprising:
- a printed circuit board having a front portion and an opposite rear portion, with a plurality of conductive traces arranged on the front portion and a number of conductive pads arranged on the rear portion;
- a first connector having an insulated housing and a plurality of contacts received therein, said contacts connected to the conductive traces of the front portion of the printed circuit board;
- a second connector and third connector alternatively connected to certain conductive pads of the rear portion of the printed circuit board via corresponding cable;
- wherein the first connector has a pair of arms integrated with the insulated housing, said pair of arms fastened to the front portion of the printed circuit board;
- wherein a first interior insulator is molded over the pair of the arms and the front portion of the printed circuit board.

6. The cable assembly as recited in claim 5, wherein a strain relief member is attached to a front portion of the cable.

7. The cable assembly as recited in claim 6, wherein a cover is molded over the first interior insulator and the strain relief member.

8. The cable assembly as recited in claim 7, wherein at least a notch is defined in a peripheral portion of the first interior insulator and wrapped in the cover.

9. The cable assembly as recited in claim 7, wherein at least a first retaining hole is defined in the front portion of the printed circuit board and enclosed within the first interior insulator.

10. The cable assembly as recited in claim 6, wherein the rear portion of the printed circuit board defines a cutout receiving partial of the strain relief member.

11. The cable assembly as recited in claim 10, wherein the conductive pads are divided into a group of first conductive pads and another group of second conductive pads both disposed two sides about the cutout, wherein wires of the cables are divided into two rows, with front ends extending backward and soldered to the two groups of the conductive pads, respectively.

12. The cable assembly as recited in claim 11, wherein at least a grounding pad is arranged on the rear portion of the printed circuit board and in front of the cutout, and further electrically connects to a metallic braiding portion of the cable.

13. A cable assembly comprising:
- an insulative housing defining a front mating port with a plurality of contacts therein;
- a printed circuit board located behind the housing and including a front edge region mechanically and electrically connected to the corresponding contacts;
- a cutout formed in a rear edge region of the printed circuit board;
- a conductive grounding member disposed in the cutout with grounding fingers mechanically and electrically engaged with corresponding pads on the rear edge region of the printed circuit board;
- a dielectric strain relief disposed in the cutout behind and outside said grounding member; and
- a round cable extending rearwardly from said cutout; wherein
- said cable includes a plurality of wires extending forward from an end of the cable and successively backward to mechanically and electrically engaged with corresponding pads.

14. The cable assembly as claimed in claim 13, wherein spaced front interior insulator and rear insulator are integrally molded with the front edge region and the rear edge region of the printed circuit board, and commonly protectively enclosed in a cover.

* * * * *